(12) United States Patent
Yeh et al.

(10) Patent No.: US 9,795,028 B2
(45) Date of Patent: Oct. 17, 2017

(54) PACKAGE STRUCTURE OF ELECTRONIC DEVICE

(71) Applicant: Industrial Technology Research Institute, Hsinchu (TW)

(72) Inventors: Shu-Tang Yeh, Taichung (TW); Chia-Hao Tsai, New Taipei (TW); Mei-Ru Lin, Changhua County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/051,645

(22) Filed: Feb. 23, 2016

(65) Prior Publication Data

US 2016/0174366 A1 Jun. 16, 2016

Related U.S. Application Data

(62) Division of application No. 13/934,222, filed on Jul. 2, 2013, now abandoned.

(30) Foreign Application Priority Data

Jan. 11, 2013 (TW) .............................. 102101184 A

(51) Int. Cl.
*H05K 1/02* (2006.01)
*H05K 5/06* (2006.01)
*H05K 1/18* (2006.01)

(52) U.S. Cl.
CPC ........... *H05K 1/0274* (2013.01); *H05K 1/183* (2013.01); *H05K 5/064* (2013.01)

(58) Field of Classification Search
CPC ....... H05K 1/0274; H05K 1/183; H05K 1/064
See application file for complete search history.

(56) References Cited

U.S. PATENT DOCUMENTS

| | | | | |
|---|---|---|---|---|
| 6,081,071 A | * | 6/2000 | Rogers | H05B 33/04 313/512 |
| 7,541,671 B2 | * | 6/2009 | Foust | H01L 51/0097 257/680 |
| 9,303,842 B2 | * | 4/2016 | Cheon | F21V 11/00 |
| 2003/0143423 A1 | * | 7/2003 | McCormick | H01L 51/5237 428/690 |

(Continued)

*Primary Examiner* — Hoa C Nguyen
*Assistant Examiner* — Christopher L Augustin
(74) *Attorney, Agent, or Firm* — Jianq Chyun IP Office

(57) ABSTRACT

A package structure of an electronic device includes a first substrate, a second substrate, an electronic device and a first barrier structure. The first substrate includes a first light-transmitting portion and a periphery portion. The second substrate includes a second light-transmitting portion and two covering portions located on two sides of the second light-transmitting portion. The first light-transmitting portion is disposed corresponding to the second light-transmitting portion, and a device disposition region exists therebetween. The covering portions cover the periphery portion of the first substrate and two opposite side surfaces of the first substrate. The electronic device is disposed on the first or second substrate, and is located in the device disposition region. The first barrier structure disposed on the first substrate or the second substrate is disposed corresponding to the periphery portion and disposed on at least one side of the device disposition region.

13 Claims, 13 Drawing Sheets

(56) References Cited

U.S. PATENT DOCUMENTS

| | | | |
|---|---|---|---|
| 2005/0224935 A1* | 10/2005 | Schaepkens | H01L 51/0097 257/678 |
| 2007/0247068 A1* | 10/2007 | Park | H01L 51/5246 313/512 |
| 2007/0279571 A1* | 12/2007 | Koo | H01L 51/5246 349/153 |
| 2010/0155247 A1* | 6/2010 | Cao | C08L 21/00 204/600 |
| 2010/0244057 A1* | 9/2010 | Ryu | H01L 51/5246 257/88 |
| 2012/0153814 A1* | 6/2012 | Lee | H01L 51/524 313/504 |

\* cited by examiner

PACKAGE STRUCTURE OF ELECTRONIC DEVICE

CROSS-REFERENCE TO RELATED APPLICATION

This application is a divisional of and claims priority benefit of U.S. patent application Ser. No. 13/934,222, filed on Jul. 2, 2013, now pending, which claims the priority benefit of Taiwan application serial no. 102101184, filed on Jan. 11, 2013. The entirety of each of the above-mentioned patent applications is hereby incorporated by reference herein and made a part of this specification.

TECHNICAL FIELD

The disclosure is related to a package structure of an electronic device.

BACKGROUND

Compared with normal rigid substrates, flexible substrates have a wider range of applications due to bendability, ease for carriage, safety, and broad applications in consumer products. However, flexible substrates have a large coefficient of thermal expansion and poor resistance against heat, moisture, oxygen, and chemicals. Since typical flexible substrates cannot block the transmission of moisture and oxygen completely, electronic devices on the typical flexible substrates experience accelerated aging. Consequently, these short-lived electronic devices fail to fulfill commercial needs.

Generally speaking, the electronic device is disposed between two substrates, and the upper and lower substrates are closely attached to each other with a sealant so as to reduce contact of moisture and oxygen with the electronic device. However, moisture and oxygen may still permeate through the sealant and contact with the electronic device and thereby lower down the service life of the electronic device.

SUMMARY

An embodiment of the disclosure introduces a package structure of an electronic device, including a first substrate, a second substrate, an electronic device and a first barrier structure. The first substrate includes a first light-transmitting portion and a periphery portion surrounding the first light-transmitting portion. The second substrate includes a second light-transmitting portion and two covering portions located on two sides of the second light-transmitting portion. The first and second light-transmitting portions are disposed correspondingly, and a device disposition region is arranged therebetween. The covering portions cover the periphery portion of the first substrate and cover two opposite side surfaces of the first substrate. The electronic device is disposed on the first or second substrate and is located in the device disposition region. The first barrier structure is disposed on the first or second substrate. The first barrier structure is disposed corresponding to the periphery portion, and is located on at least one side of the device disposition region.

An embodiment of the disclosure further introduces a package structure of electronic device, including a first substrate, an electronic device, a barrier layer, a second substrate and a first barrier structure. The first substrate includes a first light-transmitting portion and a periphery portion surrounding the first light-transmitting portion, and the first substrate includes an inner surface and an outer surface. The electronic device is disposed on the inner surface of the first substrate. The barrier layer includes a main portion and two covering portions located on two opposite sides of the main portion, wherein the main portion and the first light-transmitting portion are disposed correspondingly, and the main portion covers the outer surface of the first substrate. The covering portions cover a first periphery portion of the first substrate located on two opposite sides of the first light-transmitting portion, the electronic device located on the first periphery portion of the first substrate, two opposite side surfaces of the first substrate, and two opposite side surfaces of the electronic device. The second substrate and the first substrate are disposed opposite to each other, and the electronic device is disposed therebetween. The second substrate includes a second light-transmitting portion and a second periphery portion surrounding the second light-transmitting portion. The second light-transmitting portion is disposed corresponding to the first light-transmitting portion, and the second periphery portion is disposed corresponding to the first periphery portion. The first barrier structure is disposed on the second periphery portion of the second substrate.

In order to the make the present disclosure comprehensible, embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1A:
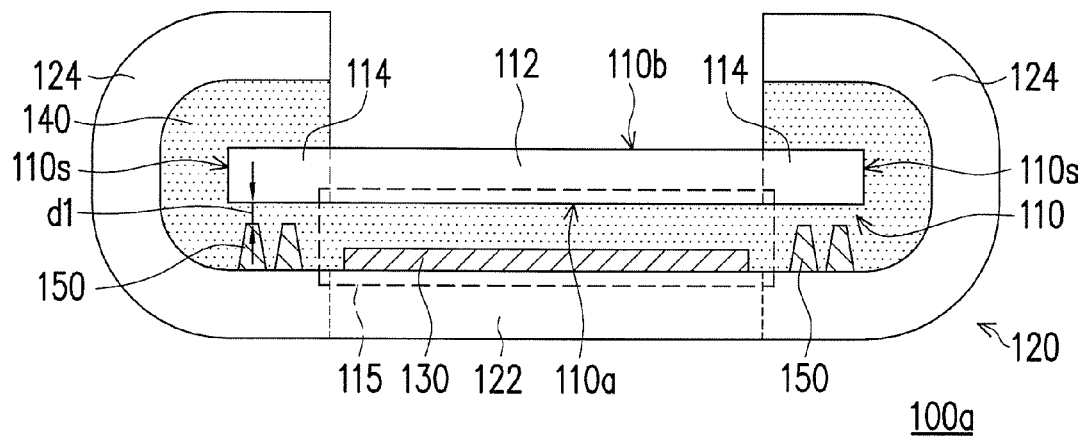
FIG. 1A is a schematic cross-sectional view of a package structure of electronic device according to the first embodiment of the disclosure.
Figure 1B:
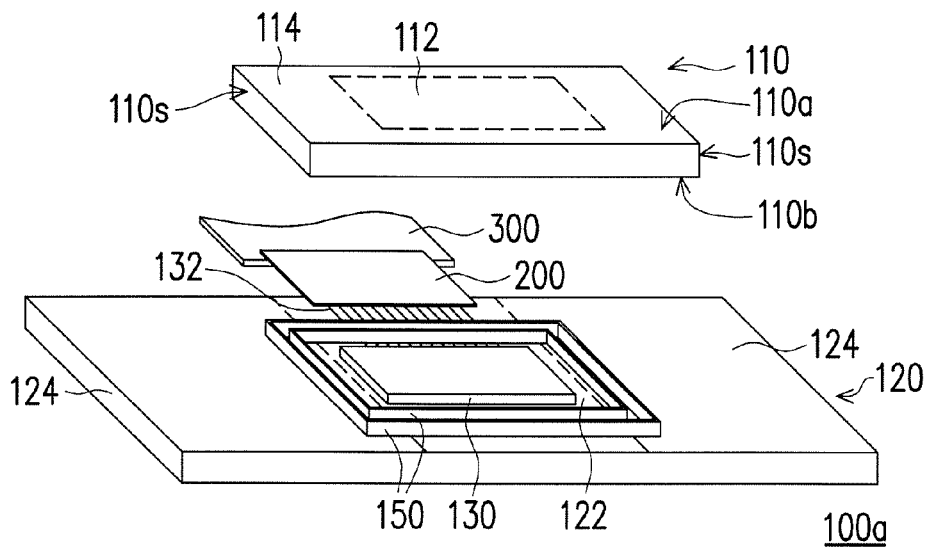
FIG. 1B is an exploded view of the package structure of electronic device in FIG. 1A before packaging.
Figure 1C:
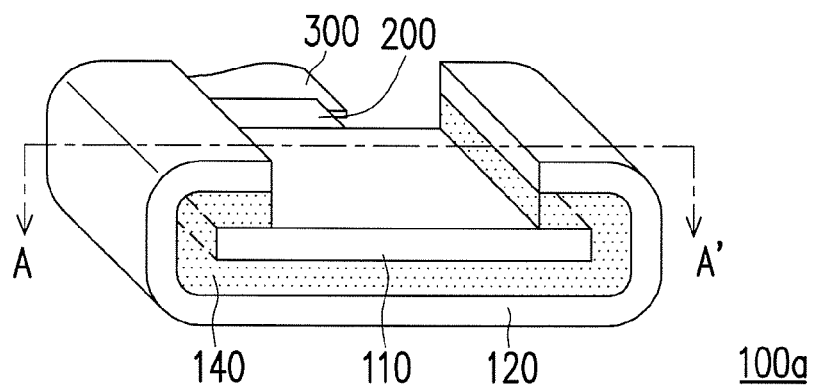
FIG. 1C is a perspective side view of the package structure of electronic device in FIG. 1B after packaging.

FIG. 1A is a schematic cross-sectional view of a package structure of electronic device according to the first embodiment of the disclosure. FIG. 1B is an exploded view of the package structure of electronic device in FIG. 1A prior to packaging. FIG. 1C is a perspective side view of the package structure of electronic device in FIG. 1B after packaging. Referring to FIGS. 1A, 1B and 1C, a package structure of an electronic device 100a includes a first substrate 110, a second substrate 120, an electronic device 130, a sealant 140 and a barrier structure 150. FIG. 1A, for example, is the schematic cross-sectional view along a section line A-A' in FIG. 1C. In order to clearly illustrate the disposition relationship between each element, part of the elements is omitted in FIGS. 1B and 1C.

The first substrate 110 includes a first light-transmitting portion 112 and a periphery portion 114, wherein the periphery portion 114 surrounds the first light-transmitting portion 112. The first substrate 110 includes an inner surface 110a and an outer surface 110b. In addition, the first substrate 110 includes two opposite side surfaces 110s. The first light-transmitting portion 112 of the first substrate 110 allows the transmission of light.

The second substrate 120 includes a second light-transmitting portion 122 and two covering portions 124. The second substrate 120 may be, for example, a transparent substrate, wherein the second light-transmitting portion 122 of the second substrate 120 allows the transmission of light. The covering portions 124 are located on two opposite sides of the second light-transmitting portion 122. The first substrate 110 and the second substrate 120 are disposed opposite to each other, and the first substrate 110 is covered by the second substrate 120, wherein the inner surface 110a of the first substrate 110 faces the second light-transmitting portion 122 of the second substrate 120. The outer surface 110b of the first substrate 110 is away from the second light-transmitting portion 122 of the second substrate 120, and part of the outer surface 110b is exposed from the covering portions 124.

The first light-transmitting portion 112 of the first substrate 110 and the second light-transmitting portion 122 of the second substrate 120 are disposed correspondingly, and a device disposition region 115 exists between the first light-transmitting portion 112 and the second light-transmitting portion 122. In addition, the covering portions 124 of the second substrate 120 are, for example, covering structures formed by curling or folding part of the second substrate 120 to cover the periphery portion 114 of the first substrate 110, and therefore the covering portions 124 have curved or bent shapes where corresponds to the side surfaces 110s of the first substrate 110. Accordingly, the covering portions 124 cover the periphery portion 114 located on two opposite sides of the first light-transmitting portion 112, and the covering portions 124 cover the side surfaces 110s located on two opposite sides of the first substrate 110.

The first substrate 110 may be a flexible substrate or a rigid substrate. The second substrate 120 may be, for example, a flexible substrate. The material of the flexible substrate may be polyethylene terephthalate (PET), polyethylene naphthalate (PEN), polyethersulfone (PES), polymethyl methacrylate (PMMA), polycarbonate (PC), PI or a metal foil. The material of the rigid substrate is, for example, glass or other suitable materials for rigid substrates. In addition, a touch device, such as a surface-capacitive touch device, a digital matrix touch device (for example, a projective capacitive touch device) or an analog matrix touch device, may further be disposed on the first substrate 110 or the second substrate 120. In the present embodiment, the first substrate 110 and the second substrate 120 both take flexible substrates for example.

In the present embodiment, the electronic device 130 is disposed on the second substrate 120 and is located in the device disposition region 115. Certainly, the disclosure is not limited thereto. As long as the electronic device 130 is located in the device disposition region 115, such an arrangement is the scope that the disclosure intends to claim. In other words, in other embodiments, the electronic device 130 may also be disposed on the first substrate 110. In the present embodiment, the electronic device 130 is disposed between the first light-transmitting portion 112 and the second light-transmitting portion 122, and therefore the package structure 100a of the electronic device may be a double-side light-emitting electronic device. If the package structure 100a of the electronic device is designed as a single-side light-emitting electronic device, a reflective layer may be disposed on the first light-transmitting portion 112 of the first substrate 110 or the second light-transmitting portion 122 of the second substrate 120, so that light generated in the electronic device 130 is emitted from either the first substrate 110 or the second substrate 120.

The electronic device 130 is, for example, an active environment-sensitive display device or a passive environment-sensitive display device. The active environment-sensitive display device is, for example, an active matrix organic light emitting diode (AMOLED) display device, an active matrix Eelectro phoretic display device (AMEPD), an active matrix liquid crystal display device (AMLCD) or an active matrix blue phase liquid crystal display device. The passive environment-sensitive display device is, for example, a passive matrix OLED (PM-OLED) or a super twisted nematic liquid crystal display device (STN-LCD).

The sealant 140 is a selective material. In the present embodiment, the sealant 140 is disposed between the first substrate 110 and the second substrate 120. With respect to the fabrication, the sealant 140, for example, is coated on the second substrate 120 where each element has been disposed, and the sealant 140 is closely covered between each element (such as the electronic device and a barrier structure described below). Then, the second substrate 120 coated with the sealant 140 is bent to cover the periphery portions 114 of the first substrate 110 located on two opposite sides of the first light-transmitting portion 112. Certainly, the disclosure is not limited thereto. In other embodiments, the sealant 140 may be coated on a predetermined region that the first substrate 110 is covering, and then the second substrate 120 is folded to cover the predetermined region of the first substrate 110. The material of the sealant 140 may be, for example, an acrylic, an expoxy or a silicone, and the form of the sealant 140 may be, for example, a pressure-sensitive sealant, a stuffed sealant, a thermal curable sealant or an ultraviolet curable sealant.

The first barrier structure 150 is disposed on the second substrate 120. In an embodiment including a sealant, the first barrier structure 150 is disposed in the sealant 140. The first barrier structure 150 is disposed corresponding to the periphery portion 114 of the first substrate 110 and surrounding the device disposition region 115. The material of the first barrier structure 150 may be, for example, a single-layer structure of organic materials, inorganic materials or mixtures of organic and inorganic materials. The first barrier structure 150 may also be a multi-layer structure stacked by organic materials, inorganic materials or mixtures of organic and inorganic materials. In the present embodiment, the first barrier structure 150 protrudes from the second substrate 120 toward the inner surface 110a of the first substrate 110. Since the path of moisture and oxygen to the electronic device 130 is extended through the first barrier structure 150, moisture and oxygen do not direct permeate to the electronic device 130. In addition, since the first barrier structure 150 is, for example, disposed surrounding the whole device disposition region 115, the capability of the package structure 110a of the electronic device in blocking moisture and oxygen on all sides is effectively increased. Accordingly, the package structure 110a of the electronic device may have good capability in blocking moisture and oxygen; however, in other embodiments, the first barrier structure may also be disposed merely surrounding at least one side (among three sides, for example) of the device disposition region 115. A gap d1 exists between the first barrier structure 150 and the inner surface 110a of the first substrate 110. The size of the gap d1 is between 0 μm and 100 μm. The smaller the gap d1 is, the less easy it is for moisture and oxygen to pass the first barrier structure 150 through the gap d1.

Figure 2A:
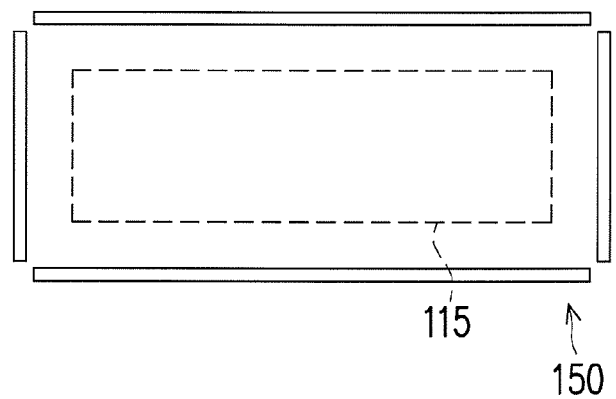
FIGS. 2A to 2H are schematic top views of the first barrier structure in other embodiments of the disclosure.
Figure 2B:
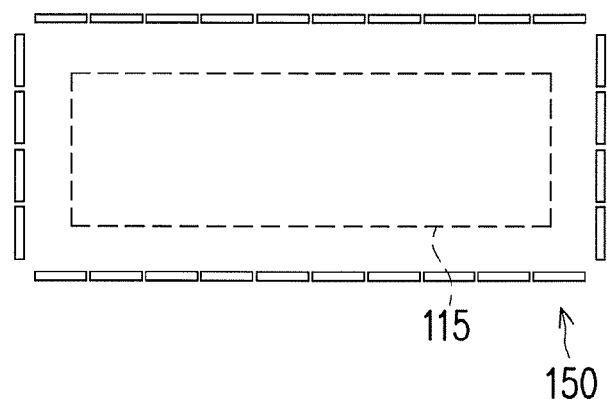
Figure 2C:
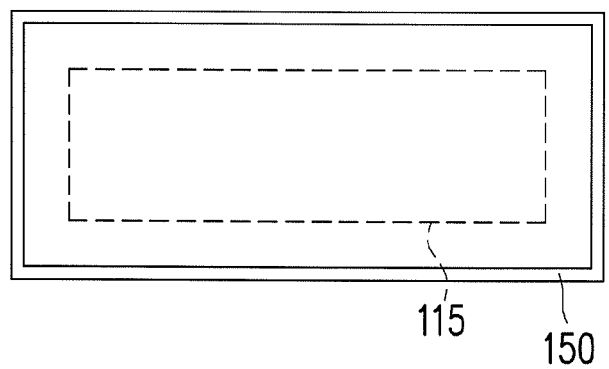
Figure 2D:
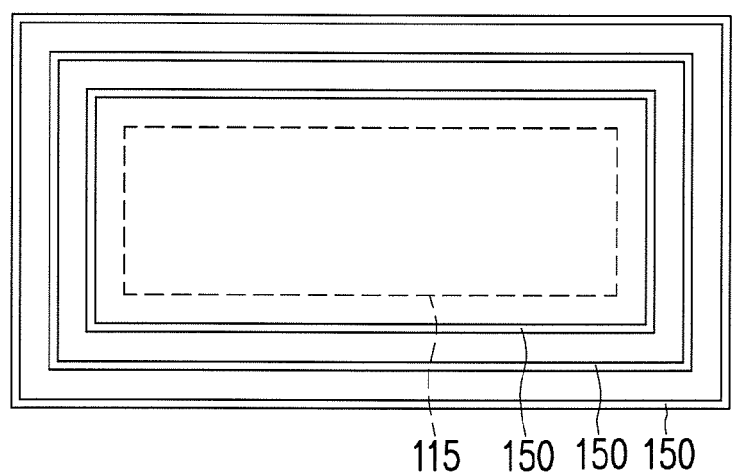
Figure 2E:
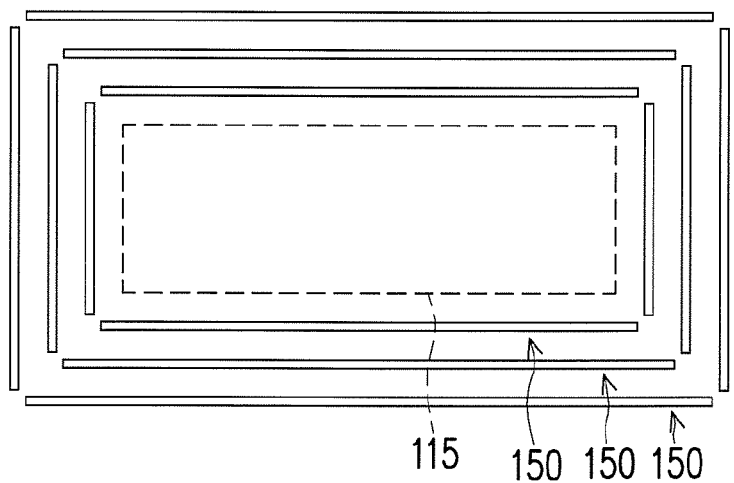
Figure 2F:
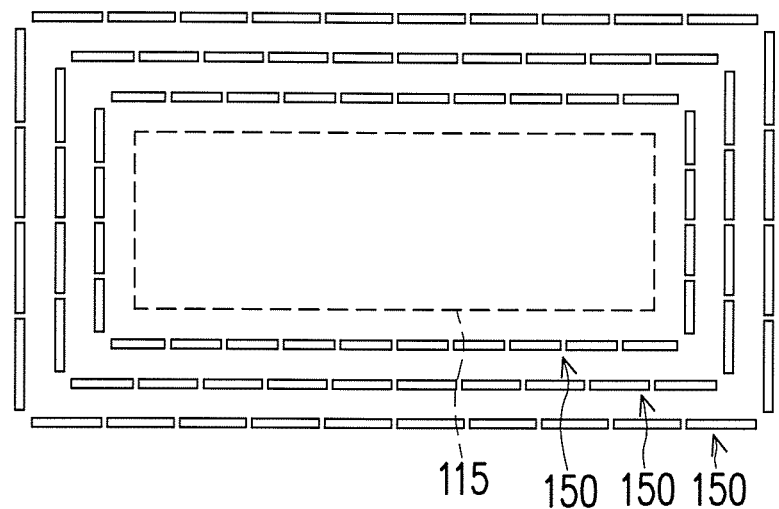

The first barrier structure 150 in the present embodiment takes a barrier structure having a continuous barrier pattern for example. In other embodiments, the first barrier structure 150 may be composed of a plurality of barrier structures arranged continuously, and the barrier structures are disposed surrounding the device disposition region 115, as shown in FIGS. 2A and 2B. In addition, the present embodiment takes the disposition of two first barrier structures 150 for example. In other embodiments, the package structure of electronic device may also include one first barrier structure 150, as shown in FIGS. 2A to 2C, or two or more first barrier structures 150, as shown in FIGS. 2D to 2F. The disclosure does not limit the number of the first barrier structure 150.

Figure 2G:
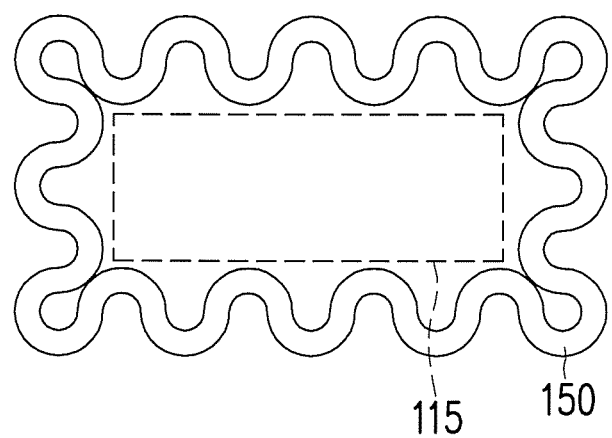
Figure 2H:
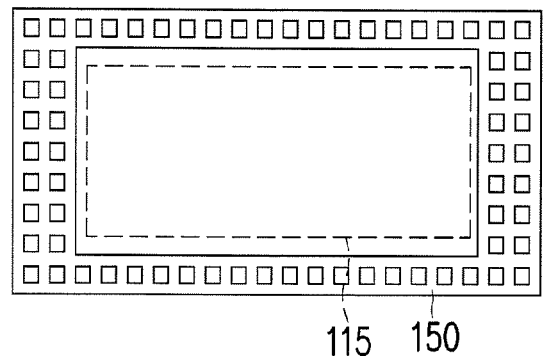

In addition, the pattern of the first barrier structure 150 in the present embodiment substantially forms a frame pattern; however, the disclosure is not limited thereto. In other embodiments, the pattern of the first barrier structure 150 may be a curve pattern as shown in FIG. 2G or a waffle pattern as shown in FIG. 2H.

In addition, the package structure 100a of the electronic device in the disclosure may form a plurality of lead wires 132 electrically connected to the electronic device 130 on the side not covered by the covering portions 124. The electronic device 130 may be selectively connected electrically to a flexible printed circuit (FPC) 200 through the lead wires 132 extending outside the second light-transmitting portion 122. Moreover, FPC 200 may be further connected to a printed circuit board 300.

With respect to the structure of the embodiment, referring to FIG. 1A, in addition to covering the inner surface 110a of the first substrate 110, the second substrate 120 further covers the periphery portion 114 of the first substrate 110 with the covering portions 124 formed by curling or folding the second substrate 120 from the edge portion and stuffs between the first substrate 110 and the second substrate 120 with the sealant 140. Accordingly, the path for moisture or oxygen in the environment to enter the sealant 140 and permeate toward the electronic device 130 from the brink side of the covering portions 124 is further extended. Thus, the package structure 110a of the electronic device has a better capability in blocking moisture and oxygen, and thereby further extends the service life of the electronic device 130 effectively.

The disclosure does not limit the position and form of the first barrier structure 150. Although the first barrier structure 150 mentioned herein is disposed on the second substrate 120, and the shape of the least cross section of the first barrier structure 150 is a trapezoid, other known structural designs capable of achieving the blockage of moisture and oxygen may still be technical solutions that the disclosure may adopt without departing from the protection scope of the disclosure. Multiple different embodiments are used hereafter to describe the design of the package structures 100b to 100p of the electronic device respectively. Certainly, the package structures 100b to 100p of the electronic device may also selectively use a lead wire for connecting with a FPC and a printed circuit board (not shown). The disclosure is not limited thereto.

Figure 3:
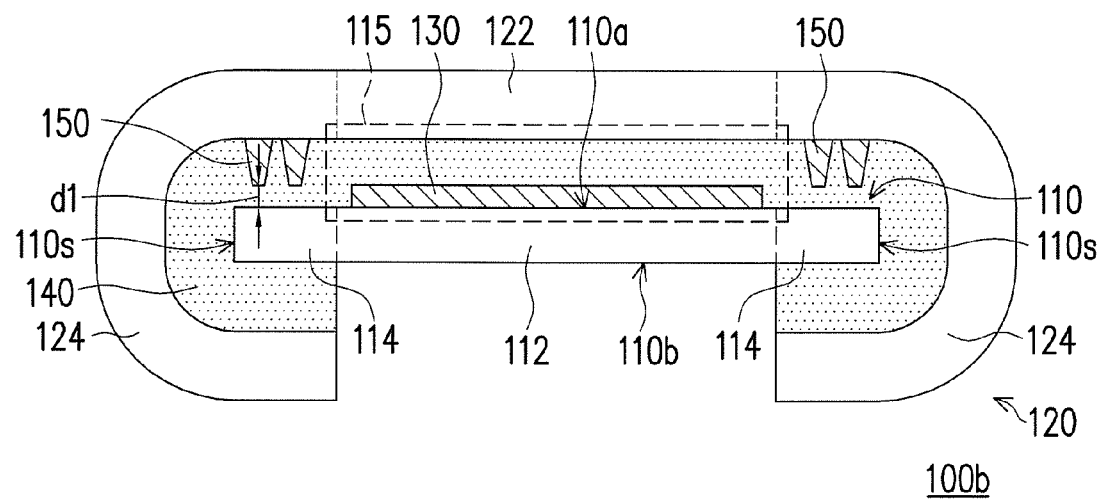
FIG. 3 is a schematic cross-sectional view of a package structure of electronic device according to another embodiment of the disclosure.

FIG. 3 is a schematic cross-sectional view of a package structure of electronic device according to another embodiment of the disclosure. Referring to FIG. 3, a package structure 100b of the electronic device in FIG. 3 is similar to the package structure 100a of the electronic device in FIG. 1A, and the difference lies in that the electronic device 130 in the package structure 100b of the electronic device in FIG. 3 is disposed on the first substrate 110.

Figure 4:
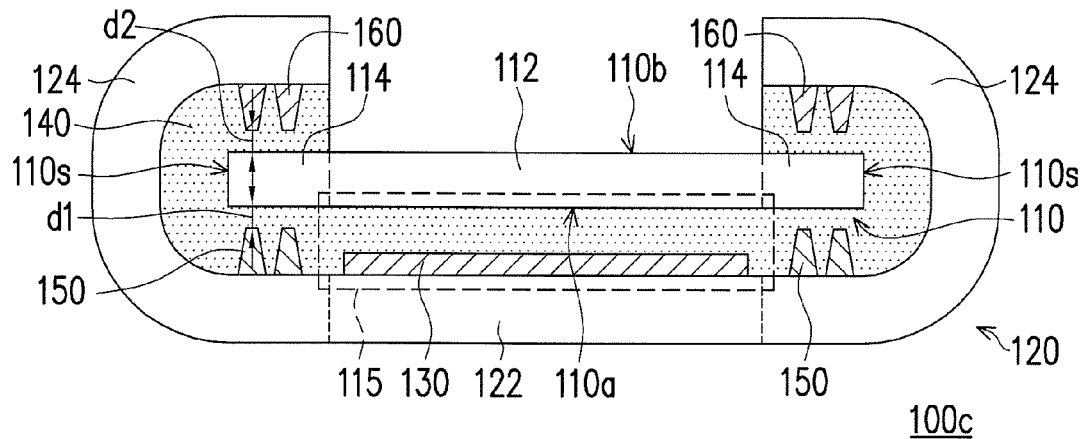
FIG. 4 is a schematic cross-sectional view of a package structure of electronic device according to another embodiment of the disclosure.

FIG. 4 is a schematic cross-sectional view of a package structure of electronic device according to another embodiment of the disclosure. Referring to FIG. 4, a package structure 100c of the electronic device in FIG. 4 is similar to the package structure 100a of the electronic device in FIG. 1A, and the difference lies in that the package structure 100c of the electronic device in FIG. 4 further includes a second barrier structure 160. The second barrier structure 160 is disposed on the second substrate 120 and is disposed corresponding to the periphery portion 114 of the first substrate 110. The second barrier structure 160 protrudes from the second substrate 120 toward the outer surface 110b of the first substrate 110, and a gap d2 exists between the second barrier structure 160 and the first substrate 110, wherein the size of the gap d2 is, for example, from 0 μm to 100 μm. The function of the second barrier structure 160 is similar to that of the first barrier structure 150. Accordingly, the package structure 100c of the electronic device has a better capability in blocking moisture and oxygen, and thereby the service life of the electronic device 130 is further extended effectively.

Figure 5:
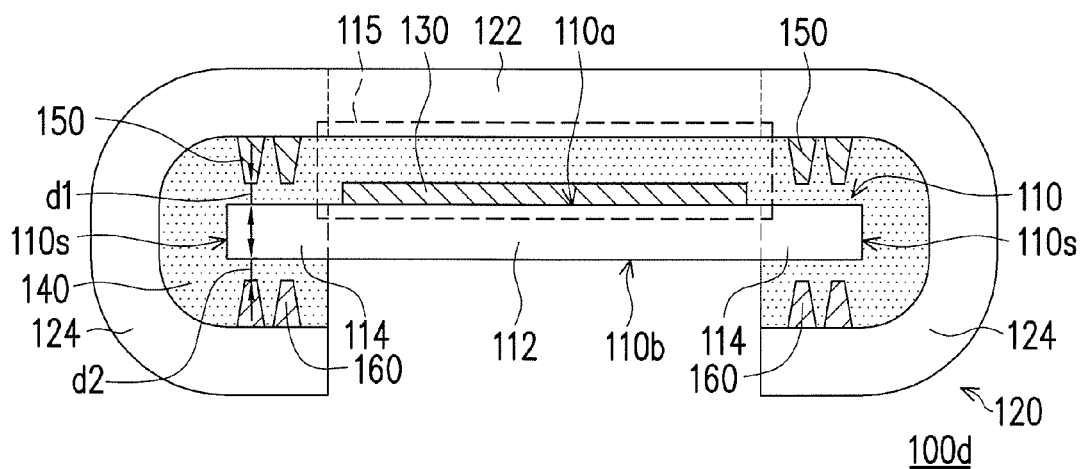
FIG. 5 is a schematic cross-sectional view of a package structure of electronic device according to another embodiment of the disclosure.

FIG. 5 is a schematic cross-sectional view of a package structure of electronic device according to another embodiment of the disclosure. Referring to FIG. 5, a package structure 100d of the electronic device in FIG. 5 is similar to the package structure 100c of the electronic device in FIG. 4, and the difference lies in that the electronic device 130 in the package structure 100d of the electronic device in FIG. 5 is disposed on the first substrate 110.

Figure 6:
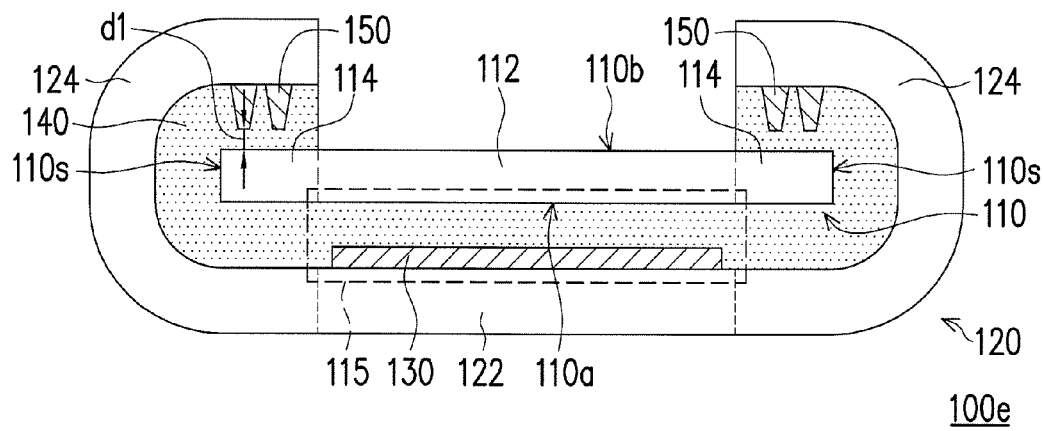
FIG. 6 is a schematic cross-sectional view of a package structure of electronic device according to another embodiment of the disclosure.

FIG. 6 is a schematic cross-sectional view of a package structure of electronic device according to another embodiment of the disclosure. Referring to FIG. 6, a package structure 100e of the electronic device in FIG. 6 is similar to the package structure 100a of the electronic device in FIG. 1A, and the difference lies in that the first barrier structure 150 of the package structure 100e of the electronic device in FIG. 6 is disposed on the second substrate 120, and the first barrier structure 150 protrudes from the second substrate 120 toward the outer surface 110b of the first substrate 110.

Figure 7:
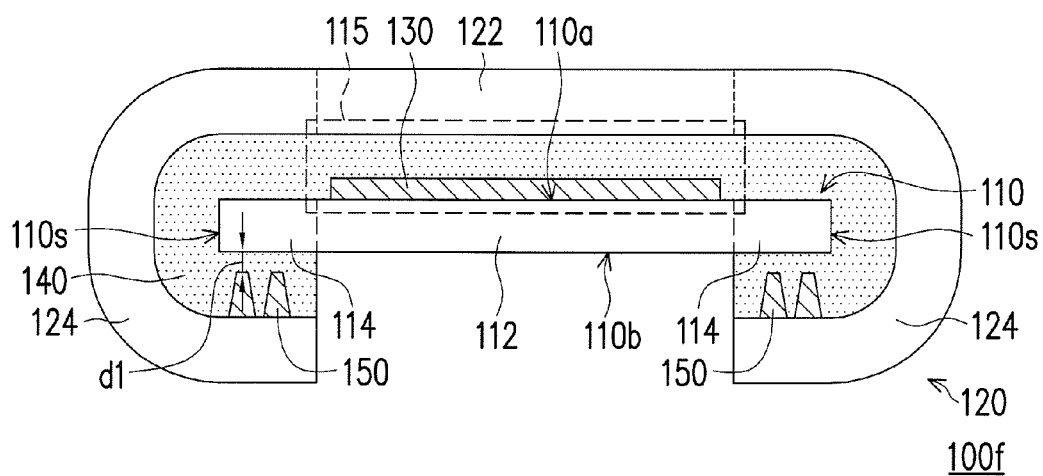
FIG. 7 is a schematic cross-sectional view of a package structure of electronic device according to another embodiment of the disclosure.

FIG. 7 is a schematic cross-sectional view of a package structure of electronic device according to another embodiment of the disclosure. Referring to FIG. 7, a package structure 100f of the electronic device in FIG. 7 is similar to the package structure 100e of the electronic device in FIG. 6, and the difference lies in that the electronic device 130 in the package structure 100f of the electronic device in FIG. 7 is disposed on the first substrate 110.

Figure 8:
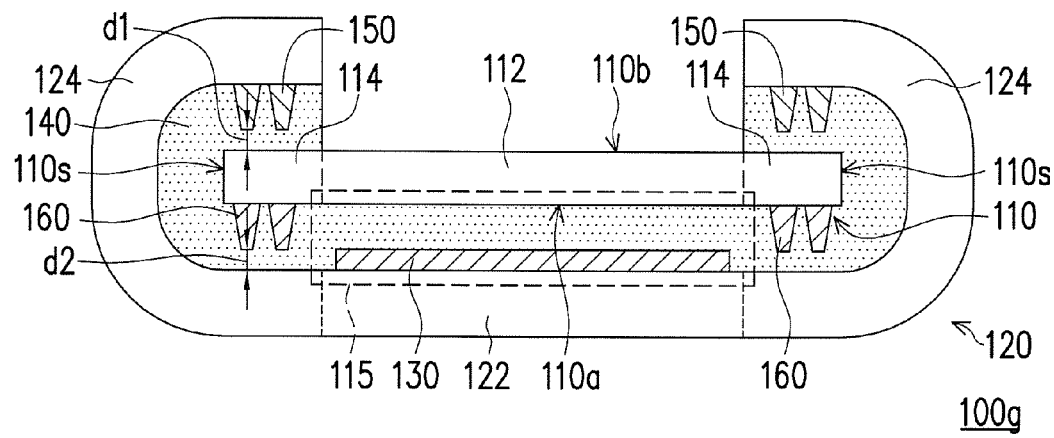
FIG. 8 is a schematic cross-sectional view of a package structure of electronic device according to another embodiment of the disclosure.

FIG. 8 is a schematic cross-sectional view of a package structure of electronic device according to another embodiment of the disclosure. Referring to FIG. 8, a package structure 100g of the electronic device in FIG. 8 is similar to the package structure 100e of the electronic device in FIG. 6, and the difference lies in that the package structure 100g of the electronic device in FIG. 8 further includes a second barrier structure 160. The second barrier structure 160 is disposed on the inner surface 110a of the first substrate 110, and is disposed corresponding to the periphery portion 114 of the first substrate 110. The second barrier structure 160 protrudes from the inner surface 110a of the first substrate 110 toward the second substrate 120. The function of the second barrier structure 160 is similar to that of the first barrier structure 150. Accordingly, the package structure 100g of the electronic device has a better capability in blocking moisture and oxygen, and thereby the service life of the electronic device 130 is further extended effectively.

Figure 9:
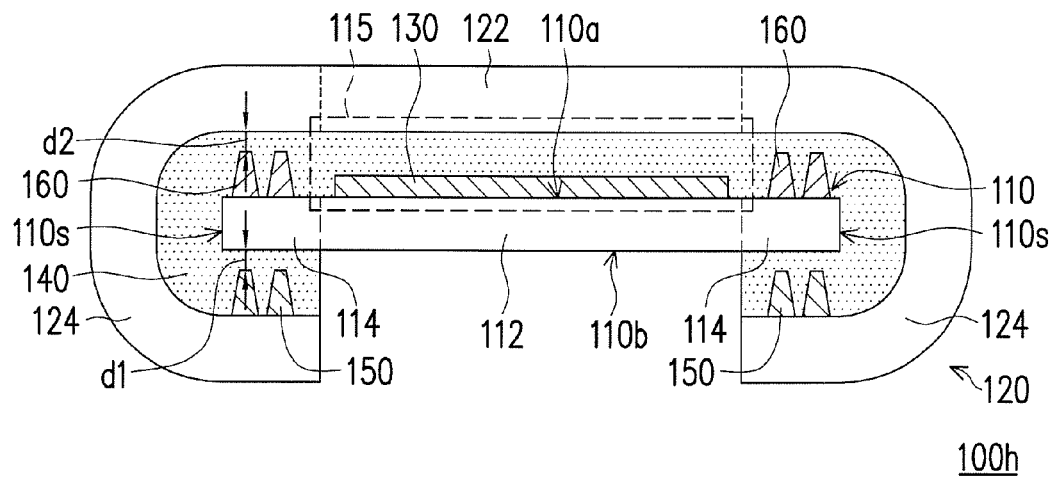
FIG. 9 is a schematic cross-sectional view of a package structure of electronic device according to another embodiment of the disclosure.

FIG. 9 is a schematic cross-sectional view of a package structure of electronic device according to another embodiment of the disclosure. Referring to FIG. 9, a package structure 100h of the electronic device in FIG. 9 is similar to the package structure 100g of the electronic device in FIG. 8, and the difference lies in that the electronic device 130 in the package structure 100h of the electronic device in FIG. 9 is disposed on the first substrate 110.

Figure 10:
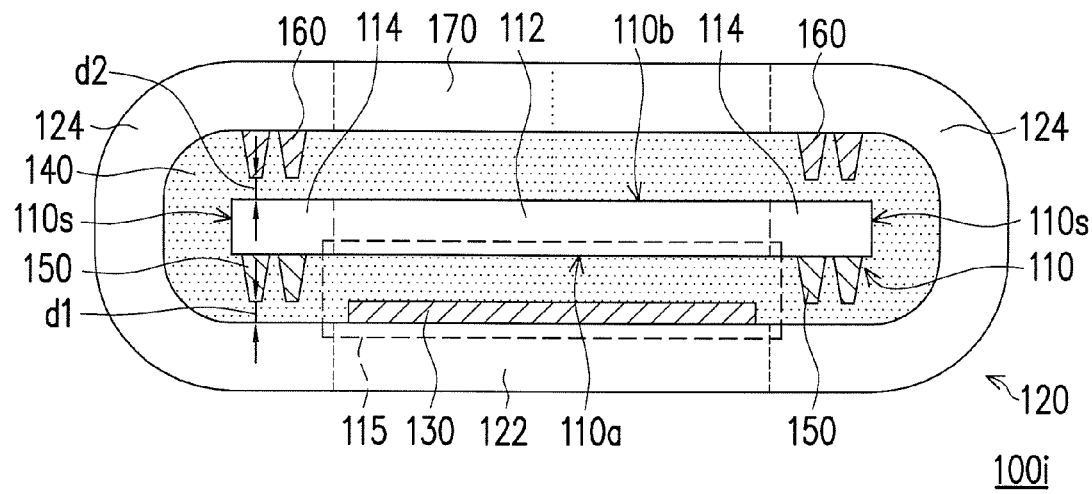
FIG. 10 is a schematic cross-sectional view of a package structure of electronic device according to another embodiment of the disclosure.

FIG. 10 is a schematic cross-sectional view of a package structure of electronic device according to another embodiment of the disclosure. Referring to FIG. 10, a package structure 100i of the electronic device in FIG. 10 is similar to the package structure 100g of the electronic device in FIG. 8, and the difference lies in that the package structure 100i of the electronic device in FIG. 10 further includes an extending portion 170. In addition to the package structure 100g of the electronic device in the embodiment of FIG. 8, the package structures 100a, 100c and 100e of the electronic device in the embodiments of FIGS. 1A, 4 and 6 may also further include the extending portion 170. The extending portion 170 is connected with two adjacent covering portions 124, and the extending portion 170 covers the outer surface 110b of the first substrate 110. The second substrate 120 of the package structure 100i of the electronic device further includes the extending portion 170 extending from the covering portions 124. When the second substrate 120 covers the first substrate 110, the extending portion 170 and the sealant 140 further covers the outer surface 110b of the first substrate 110 originally exposed by the covering portions 124. Thereby, the sealant 140 located between the extending portion 170 and the first substrate 110 is substantially covered by the extending portion 170, and therefore it is more uneasy for moisture and oxygen to enter the package structure 100i of the electronic device. Accordingly, the package structure 110i of the electronic device has a better capability in blocking moisture and oxygen, and thereby further extends the service life of the electronic device 130 effectively. In addition, the covering portions 124 of the second substrate 120 are attached more closely to the outer surface 110b of the first substrate 110 through the extending portion 170 and the sealant 140 disposed extendedly.

Figure 11:
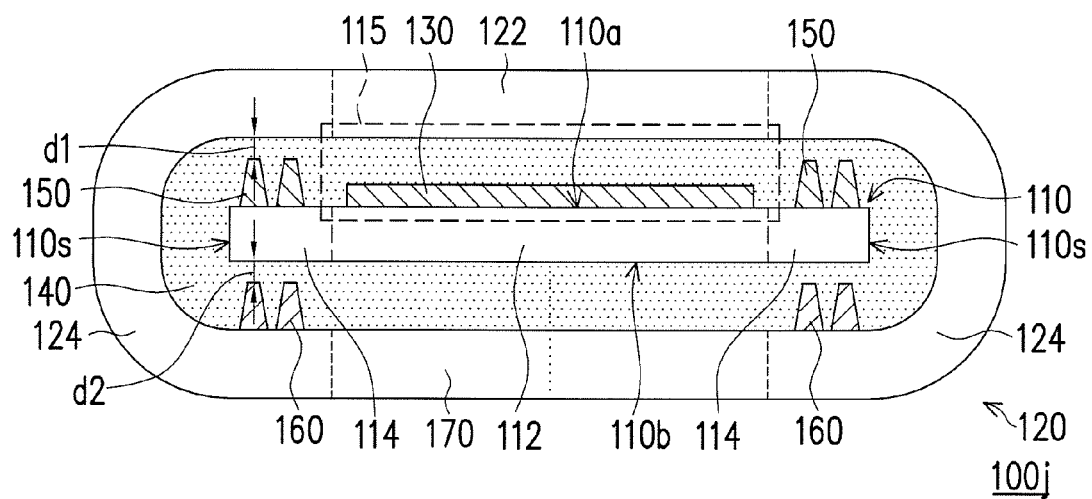
FIG. 11 is a schematic cross-sectional view of a package structure of electronic device according to another embodiment of the disclosure.

FIG. 11 is a schematic cross-sectional view of a package structure of electronic device according to another embodiment of the disclosure. Referring to FIG. 11, a package structure 100j of the electronic device in FIG. 11 is similar to the package structure 100i of the electronic device in FIG. 10, and the difference lies in that the electronic device 130 in the package structure 100j of the electronic device in FIG. 11 is disposed on the first substrate 110. That is, the package structures 100b, 100d, 100f and 100h of the electronic device in the embodiments of FIGS. 3, 5, 7 and 9 may also further include the extending portion 170.

Figure 12:
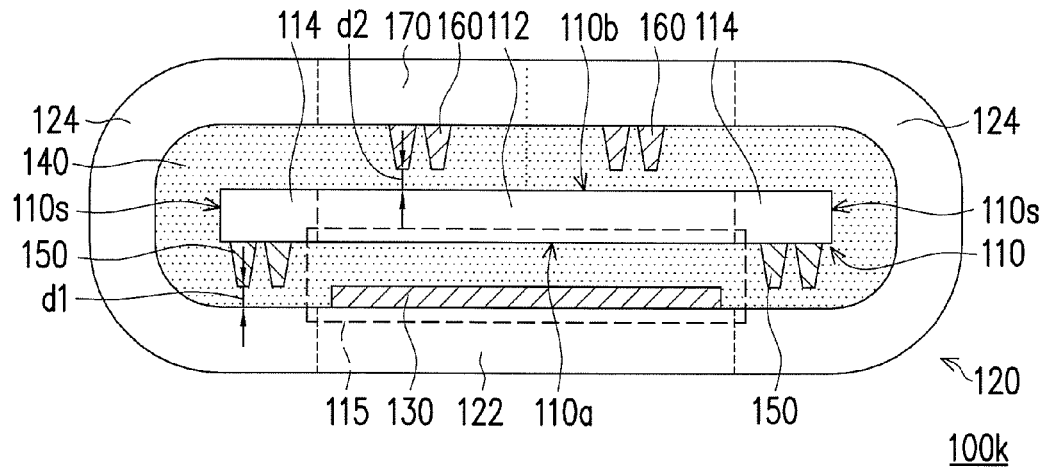
FIG. 12 is a schematic cross-sectional view of a package structure of electronic device according to another embodiment of the disclosure.

FIG. 12 is a schematic cross-sectional view of a package structure of electronic device according to another embodiment of the disclosure. Referring to FIG. 12, a package structure 100k of the electronic device in FIG. 12 is similar to the package structure 100i of the electronic device in FIG. 10, and the difference lies in that the second barrier structure 160 of the package structure 100k of the electronic device in FIG. 12 is disposed on the second substrate 120, and is disposed corresponding to the first light-transmitting portion 112 of the first substrate 110. The second barrier structure 160 protrudes from the second substrate 120 toward the outer surface 110b of the first substrate 110. The package structures 100a to 100j of the electronic device are all double-side light-emitting electronic devices; however, the disclosure is not limited thereto. In the present embodiment, the package structure 100k of the electronic device may dispose a reflective layer (not shown) on a non-light-emitting side thereof, such as the first light-transmitting portion 112 to form a single-side light-emitting electronic device, and light of the electronic device 130 is emitted from the second light-transmitting portion 122 of the second substrate.

Figure 13:
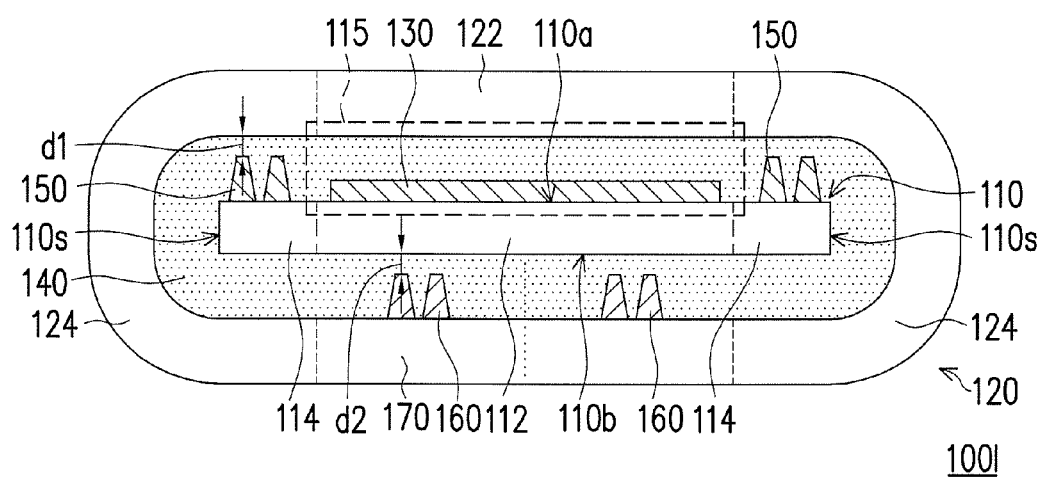
FIG. 13 is a schematic cross-sectional view of a package structure of electronic device according to another embodiment of the disclosure.

FIG. 13 is a schematic cross-sectional view of a package structure of electronic device according to another embodiment of the disclosure. Referring to FIG. 13, a package structure 100l of the electronic device in FIG. 13 is similar to the package structure 100k of the electronic device in FIG. 12, and the difference lies in that the electronic device 130 in the package structure 100l of the electronic device in FIG. 13 is disposed on the first substrate 110.

Figure 14:
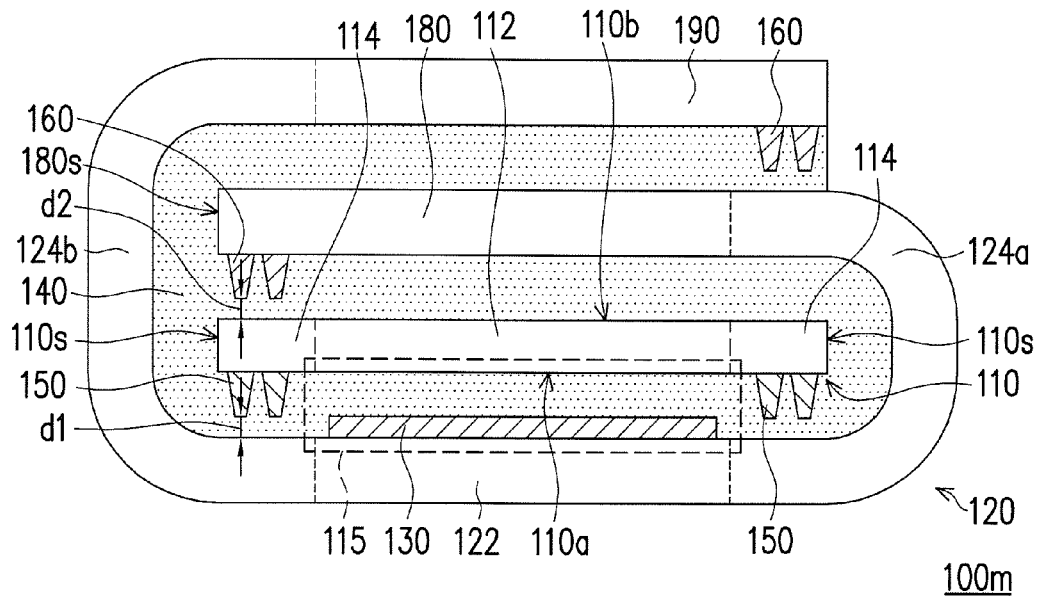
FIG. 14 is a schematic cross-sectional view of a package structure of electronic device according to another embodiment of the disclosure.

FIG. 14 is a schematic cross-sectional view of a package structure of electronic device according to another embodiment of the disclosure. Referring to FIG. 14, a package structure 100m of the electronic device in FIG. 14 is similar to the package structure 100a of the electronic device in FIG. 1, and the difference lies in that the package structure 100m of the electronic device in FIG. 14 further includes a first extending portion 180 and a second extending portion 190. In addition to the package structure 100a of the electronic device in the embodiment of FIG. 1, the package structures 100c, 100e and 100g of the electronic device in the embodiments of FIGS. 4, 6 and 8 may also further include the first extending portion 180 and the second extending portion 190. The first extending portion 180 extends from one covering portion 124a, and the first extending portion 180 covers an outer surface 110b of the first substrate 110. The second extending portion 190 extends from the other covering portion 124b, and the second extending portion 190 covers the first extending portion 180.

With respect to the fabrication, the unfolded covering portion 124a is folded first so that the first extending portion 180 covers the outer surface 110b of the first substrate 110. Then, the unfolded covering portion 124b is folded so that the second extending portion 190 covers the first extending portion 180 to form the structure as shown in FIG. 14.

With respect to the structure, the shapes of the covering portion 124b connected with the second extending portion 190 and the covering portion 124a connected with the first extending portion 180 are different. The covering portion 124a covers the periphery portion 114 of the first substrate 110 and one of the side surfaces 110s of the first substrate 110. The covering portions 124b cover the periphery portion 114 of the first substrate 110 and the other side surface 110s of the first substrate 110. In addition, the covering portion 124b further covers side surfaces 180s of the first extending portion 180. Through the first extending portion 180 and the second extending portion 190 disposed substantially overlappingly and the sealant 140 disposed extendedly, the second substrate 120 is attached closely to the first substrate 110 effectively.

In the present embodiment, the first barrier structure 150 is disposed corresponding to the periphery portion 114 and is disposed on the inner surface 110a of the first substrate 110. In addition, the package structure 100m of the electronic device further includes the second barrier structure 160. The second barrier structure 160 is disposed corresponding to the periphery portion 114 of the first substrate 110, and is disposed on the second substrate 120. The second barrier structure 160 is disposed on the first extending portion 180 of the second substrate 120 and is continuously disposed on the second extending portion 190, wherein the second barrier structure 160 located on the first extending portion 180 protrudes toward the outer surface 110b of the first substrate 110, and the second barrier structure 160 located on the second extending portion 190 protrudes toward the first extending portion 180.

Figure 15:
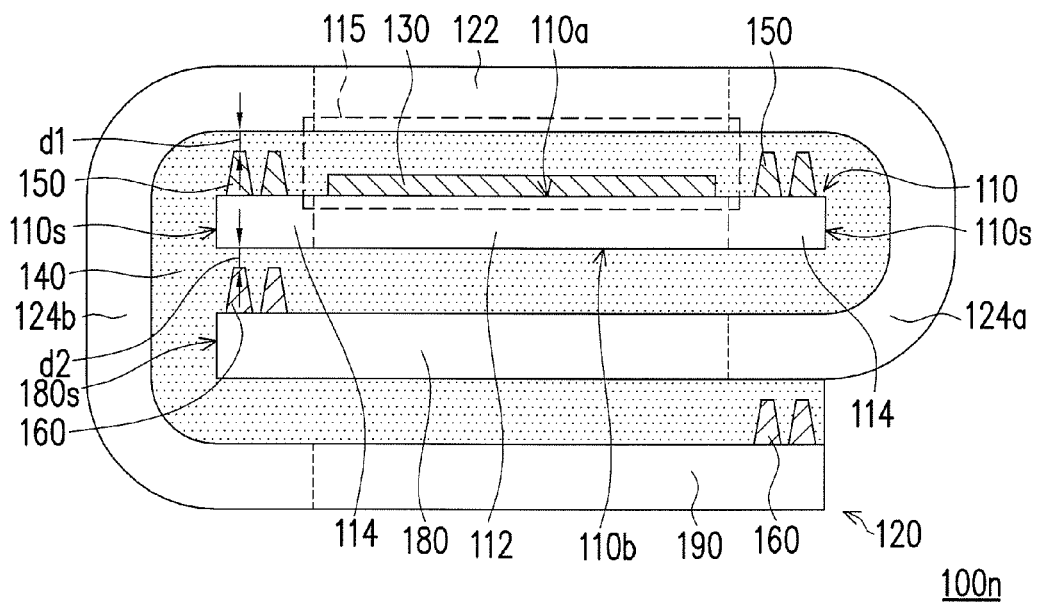
FIG. 15 is a schematic cross-sectional view of a package structure of electronic device according to another embodiment of the disclosure.

FIG. 15 is a schematic cross-sectional view of a package structure of electronic device according to another embodiment of the disclosure. Referring to FIG. 15, a package structure 100n of the electronic device in FIG. 15 is similar to the package structure 100m of the electronic device in FIG. 14, and the difference lies in that the electronic device 130 in the package structure 100n of the electronic device in FIG. 15 is disposed on the first substrate 110. That is, the package structures 100b, 100d, 100f and 100h of the electronic device in the embodiments of FIGS. 3, 5, 7 and 9 may also further include the first extending portion 180 and the second extending portion 190.

Figure 16:
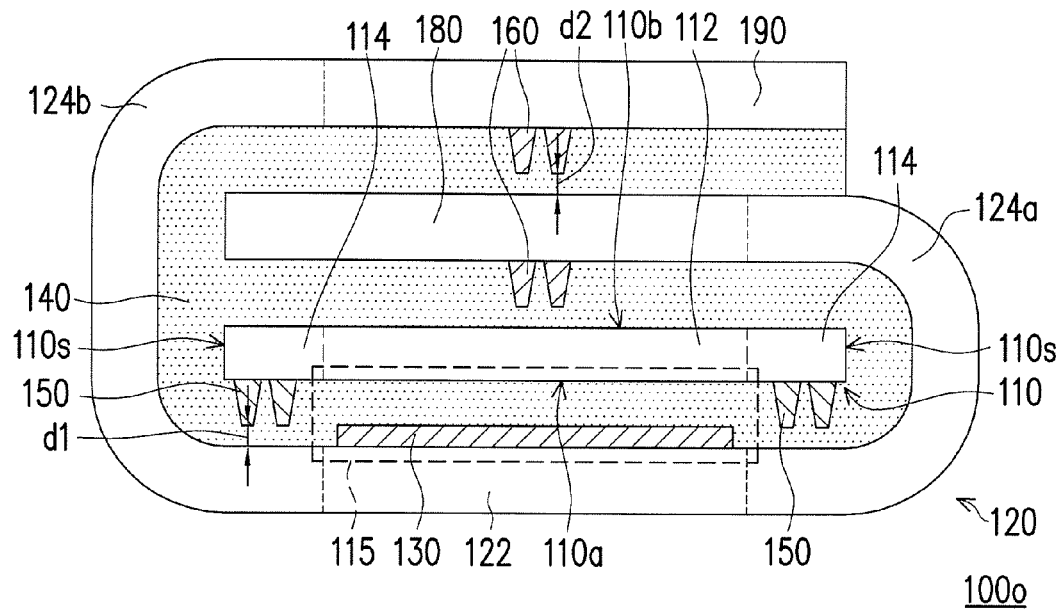
FIG. 16 is a schematic cross-sectional view of a package structure of electronic device according to another embodiment of the disclosure.

FIG. 16 is a schematic cross-sectional view of a package structure of electronic device according to another embodiment of the disclosure. Referring to FIG. 16, a package structure 100o of the electronic device in FIG. 16 is similar to the package structure 100m of the electronic device in FIG. 14, and the difference lies in that the second barrier structure 160 of the package structure 100o of the electronic device in FIG. 16 is disposed corresponding to the first light-transmitting portion 112 of the first substrate 110 and is disposed on the second substrate 120. In other words, the package structure 100o of the electronic device is, for example, a single-side light-emitting electronic device, and light of the electronic device 130 is emitted from the second light-transmitting portion 122 of the second substrate 120.

Figure 17:
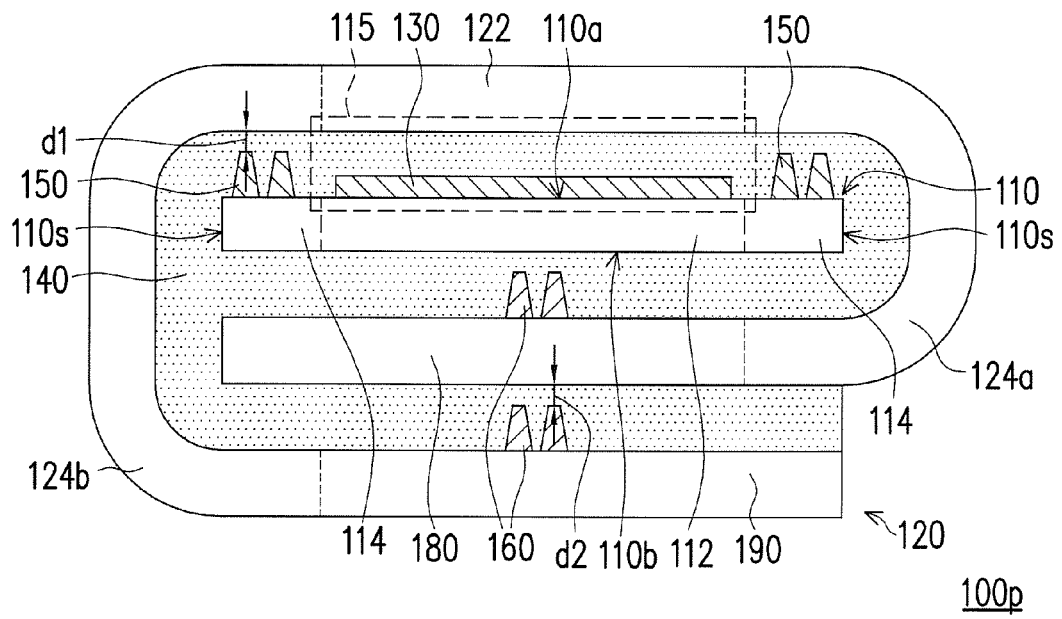
FIG. 17 is a schematic cross-sectional view of a package structure of electronic device according to another embodiment of the disclosure.

FIG. 17 is a schematic cross-sectional view of a package structure of electronic device according to another embodiment of the disclosure. Referring to FIG. 17, a package structure 100p of the electronic device in FIG. 17 is similar to the package structure 100o of the electronic device in FIG. 16, and the difference lies in that the electronic device 130 in the package structure 100p of the electronic device in FIG. 17 is disposed on the first substrate 110.

Figure 18:
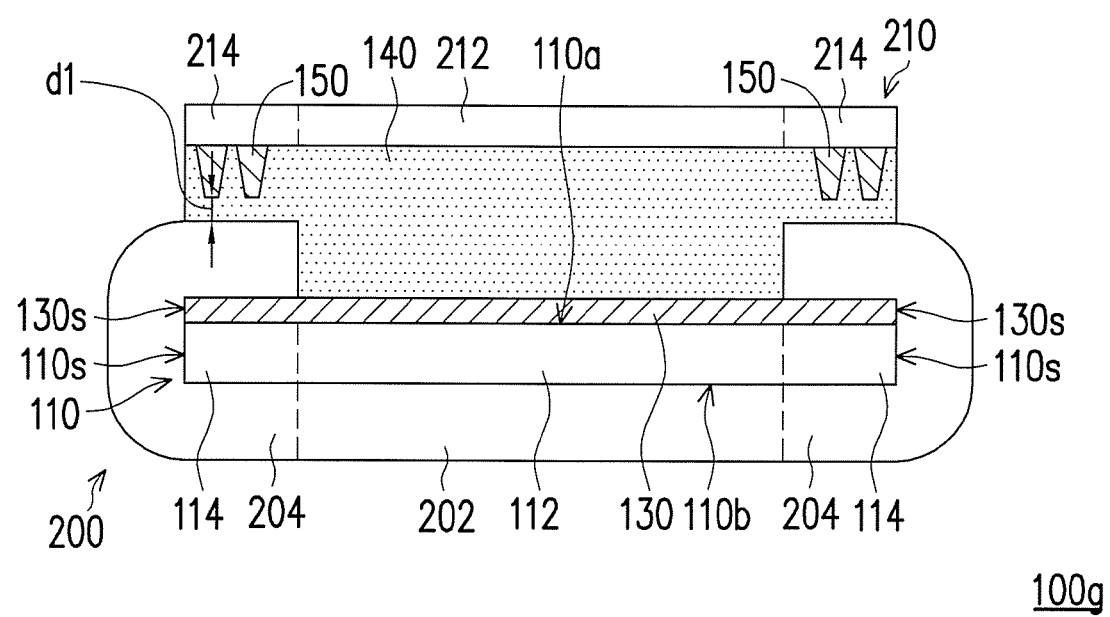
FIG. 18 is a schematic cross-sectional view of a package structure of electronic device according to another embodiment of the disclosure.

FIG. 18 is a schematic cross-sectional view of a package structure of electronic device according to another embodiment of the disclosure. Referring to FIG. 18, a package structure 100q of the electronic device of the present embodiment includes the first substrate 110, the electronic device 130, a barrier layer 200, a second substrate 210 and the first barrier structure 150. In the present embodiment, elements identical to the above embodiments are marked with identical numerals, and technical contents thereof may be referred to in the above embodiments.

The first substrate 110 includes a first light-transmitting portion 112 and a first periphery portion 114 surrounding the first light-transmitting portion 112. The first substrate 110 includes an inner surface 110a and an outer surface 110b. The electronic device 130 is disposed on the inner surface 110a of the first substrate 110.

The barrier layer 200 includes a main portion 202 and two covering portions 204 located on two opposite sides of the main portion 202, wherein the main portion 202 and the first light-transmitting portion 112 are disposed correspondingly, and the main portion 202 covers the outer surface 110b of the first substrate 110. The covering portions 204 cover the first periphery portion 114 of the first substrate 110 located on two opposite sides of the first light-transmitting portion 112, covers the electronic device 130 located on the first periphery portion 114 of the first substrate 110, covers the two opposite side surfaces 110s of the first substrate 110, and covers two opposite side surfaces 130s of the electronic device 130.

Further to the above, the material of the barrier layer 200 may be organic materials, metallic materials or inorganic materials, wherein the organic materials are, for example, small-molecular materials, organic oligomers, mixtures of oligomers and inorganic materials or mixtures of organic small-molecule and inorganic materials. The molecular weight of organic small-molecule compounds is between approximately 10 g/mol to 5,000 g/mol, such as Alq3(Tris-(8-hydroxyquinoline)aluminum), alpha-NPB(N,N'-Dis(naphthalene-1-yl)-N,N'-diphenyl-benzidine) or CuPc (Phthalocyanine copper complex). The molecular weight of the organic Oligomers is between proximately 500 g/mol to 9,000 g/mol, such as phenylene vinylene oligomers or fluorene oligomers. The molecular weight of the organic-inorganic co-steaming materials is between proximately 3 g/mol to 500 g/mol.

The metallic materials are, for example, Al, Ag, Au, Be, Cr, Cu, Co, Fe, Ge, Ir, In, Mo, Mn, Mg, Ni, Nb, Pb, Pd, Pt, Ru, Rh, Sn, Si, Sb, Se, Ti, Ta, Te, V, W, Zr, Zn, Mg/Ag, Al/Ag, Al/Si, Al/Si/Cu, Au/Ge, Au/Be, Au/Ge/Ni, Ni/Cr, Pb/Sn or In/Sn.

The inorganic materials are, for example, ITO, IZO, AZO, WO3, MoO3, SiOx, SiNx, SiOxNy, Al2O3, AlN, BaTiO3, CeO2, Cr2O3, CuO, Dy2O3, Er2O3, Eu2O3, Ga2O3, GeO2, HfO2, Ho2O3, In2O3, ITO, PbTiO3, MgO, MnO2, Nd2O3, NiO, Nb2O5, Pr2O3, Sm2O3, SiO2, SiO, Ta2O5, ThO2, SnO2, TiO3, Y2O3, ZnO, ZrO2, CdTe, ZnTe, CdSe, CdS, ZnS or MoS2.

The covering portions 204 of the barrier layer 200 are, for example, covering structures formed by curling part of the barrier layer 200 to cover the first periphery portion 114 of the first substrate 110 and part of the electronic device 130. Therefore, the covering portions 204 have bent shapes where correspond to the side surfaces 110s of the first substrate 110 and the side surfaces 130s of the electronic device 130. The barrier layer 200 effectively reduces the possibility of direct contact of moisture and oxygen with the electronic device 130.

The second substrate 210 is disposed opposite to the first substrate 110, and the electronic device 130 is disposed between the first substrate 110 and the second substrate 210. The second substrate 210 includes a second light-transmitting portion 212 and a second periphery portion 214 surrounding the second light-transmitting portion 212. The second light-transmitting portion 212 is disposed corresponding to the first light-transmitting portion 112, and the second periphery portions 214 are disposed corresponding to the first periphery portion 114.

A sealant 140 is a selective material. In the present embodiment, the sealant 140 is disposed between the first substrate 110 and the second substrate 210 for binding, and the electronic device 130 is packaged between the first substrate 110 and the second substrate 210. On the other hand, since the second substrate 210 covers the sealant 140, the entry of moisture and oxygen from the sealant 140 into the electronic device 130 is reduced. In addition, the second substrate 210 of the present embodiment is, for example, a touch panel having a touch control function, and is disposed on one side of the display face of the electronic device 130, for example. Thus, the second substrate 210 has both functions of touch control function and blockage of moisture and oxygen.

The first barrier structure 150 is disposed on the second periphery portions 214 of the second substrate 210 and in the sealant 140. The first barrier structure 150 is disposed corresponding to the first periphery portion 114 of the first substrate 110 and surrounding the electronic device 130. Therefore, the capability of the package structure 100q of the electronic device in blocking moisture and oxygen on all sides is effectively increased. Thereby, the package structure 100q of the electronic device has good capability in blocking moisture and oxygen. A gap d1 exists between the first barrier structure 150 and the barrier layer 200. The size of the gap d1 is between 0 µm and 100 µm. The smaller the gap d1 is, the less easy it is for moisture and oxygen to pass the first barrier structure 150 through the gap d1.

Experiment: Test with High Temperature and High Humidity

Package structures of the electronic device in experimental examples 1 to 3 and a comparative example are shown in FIG. 3, wherein the material of the first substrate is a PI, and the material of the second substrate is a metal foil. The electronic device is an Active Matrix Organic Light Emitting Diode, and the material of the first barrier structure is a metal foil. In the package structures of the electronic device in the experimental examples 1 to 3 and the comparative example, the first and second substrates are closely attached to each other with a sealant having an approximate thickness of 20 µm, wherein the size of a gap between the barrier structure and the first substrate of the package structure of electronic device in the experimental example 1 is approximately 11 µm, and the size of a gap between the barrier structure and the first substrate of the package structure of electronic device in the experimental example 2 is approximately 3 µm.

The package structures of the electronic device in the experimental examples 1 and 2 and the comparative example are tested with high temperature and high humidity. That is, the package structures of the electronic device for test are arranged in an environment having a temperature of 60° C. and a relative humidity of 90% RH for a period of time (i.e., testing time), and then the package structures of the electronic device for test are removed and the electronic devices are turned on. Ratios of normal pixels are measured, and testing times are 0 hour (hr) to 1,000 hrs. Criteria of the number and height of the barrier structures used in the package structures of the electronic device in the experimental examples 1 and 2 and the comparative example are shown in Table 1. Testing results of the ratio of illuminating pixels of the electronic device are shown in Table 2.

TABLE 1

|  | Comparative example | Experimental example 1 | Experimental example 2 |
|---|---|---|---|
| Number of the barrier structures | 0 | 8 | 8 |
| Height of the barrier structures | 0 | 10 | 20 |

TABLE 2

| Illuminating time | Comparative example | Experimental example 1 | Experimental example 2 |
|---|---|---|---|
| 0 hr | 100% | 100% | 100% |
| 120 hrs | 97% | 97% | 97% |
| 240 hrs | 82% | 95% | 91% |
| 360 hrs | 15% | 43% | 82% |
| 500 hrs | 7% | 27% | 76% |
| 700 hrs | 0% | 11% | 71% |
| 900 hrs | 0% | 3% | 56% |
| 1000 hrs | 0% | 3% | 56% |

In light of the above, the package structure of electronic device of the disclosure includes a barrier structure disposed continuously surrounding the device disposition region, and the electronic device is disposed in the device disposition region. Since the barrier structure blocks the transmission of moisture and oxygen effectively, the service life of the electronic device is effectively extended. In addition, the package structure of electronic device in the disclosure further covers the periphery portion of the first substrate with the sealant and the covering portions of the second substrate, and therefore further extends the transmission path of moisture and oxygen into the electronic device in the device disposition region. Thereby, the service life of the electronic device is effectively extended.

Although the disclosure has been described with reference to the above embodiments, it will be apparent to one of ordinary skill in the art that modifications and variations to the described embodiments may be made without departing from the spirit and scope of the disclosure. Accordingly, the scope of the disclosure will be defined by the attached claims, not by the above detailed descriptions.

What is claimed is:

1. A package structure of an electronic device, comprising:
    a first substrate, comprising a first light-transmitting portion and a periphery portion surrounding the first light-transmitting portion;
    a second substrate, comprising a second light-transmitting portion, two covering portions located on two opposite sides of the second light-transmitting portion and an extending portion, the first light-transmitting portion and the second light-transmitting portion being disposed correspondingly, and a device disposition region being disposed therebetween, wherein the covering portions cover the periphery portion of the first substrate located on two opposite sides of the first light-transmitting portion and cover two opposite side surfaces of the first substrate, the extending portion is connected with the covering portions and covers an outer surface of the first substrate, and the extending portion and the covering portions are integrally formed;
    an electronic device, disposed on the first substrate or the second substrate and located in the device disposition region; and
    a first barrier structure, disposed on the first substrate or the second substrate, wherein the first barrier structure is disposed corresponding to the periphery portion and located on at least one side of the device disposition region.

2. The package structure of electronic device as claimed in claim 1, further comprising a sealant, disposed between the first substrate and the second substrate, and the first barrier structure is disposed in the sealant.

3. The package structure of electronic device as claimed in claim 1, wherein the first substrate comprises an inner surface opposite to the outer surface, and the electronic device is disposed on the second substrate and faces the inner surface of the first substrate.

4. The package structure of electronic device as claimed in claim 3, further comprising a second barrier structure disposed corresponding to the periphery portion, wherein the second barrier structure is disposed on the second substrate and protrudes toward the outer surface of the first substrate.

5. The package structure of electronic device as claimed in claim 3, further comprising a second barrier structure disposed corresponding to the periphery portion, wherein the first barrier structure is disposed on the inner surface of the first substrate, and the second barrier structure is disposed on the second substrate and protrudes toward the outer surface of the first substrate.

6. The package structure of electronic device as claimed in claim 1, wherein the first substrate comprises an inner surface opposite to the outer surface, and the electronic device is disposed on the inner surface.

7. The package structure of electronic device as claimed in claim 6, further comprising a second barrier structure disposed corresponding to the periphery portion, wherein the second bather structure is disposed on the second substrate and protrudes toward the outer surface of the first substrate.

8. The package structure of electronic device as claimed in claim 6, further comprising a second barrier structure disposed corresponding to the periphery portion, wherein the first barrier structure is disposed on the inner surface of the first substrate, and the second barrier structure is disposed on the second substrate and protrudes toward the outer surface of the first substrate.

9. The package structure of electronic device as claimed in claim 1, wherein a gap is between the first barrier structure and the first substrate or second substrate oppositely, and the size of the gap is 0 μm to 100 μm.

10. The package structure of electronic device as claimed in claim 1, wherein the first barrier structure is disposed surrounding the device disposition region.

11. The package structure of electronic device as claimed in claim 1, wherein the first bather structure comprises a continuous pattern.

12. The package structure of electronic device as claimed in claim 1, wherein the first barrier structure comprises a plurality of patterns arranged continuously.

13. The package structure of electronic device as claimed in claim 1, wherein the pattern of the first barrier structure is a frame pattern, a waffle pattern or a curve pattern.

* * * * *